(12) United States Patent
Doris et al.

(10) Patent No.: US 8,860,138 B2
(45) Date of Patent: Oct. 14, 2014

(54) STRAINED THIN BODY CMOS DEVICE HAVING VERTICALLY RAISED SOURCE/DRAIN STRESSORS WITH SINGLE SPACER

(75) Inventors: Bruce B. Doris, Brewster, NY (US); Kangguo Cheng, Schenectady, NY (US); Ali Khakifirooz, Slingerlands, NY (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 13/531,053

(22) Filed: Jun. 22, 2012

(65) Prior Publication Data

US 2012/0261757 A1    Oct. 18, 2012

Related U.S. Application Data

(62) Division of application No. 12/816,399, filed on Jun. 16, 2010, now Pat. No. 8,546,228.

(51) Int. Cl.
| | |
|---|---|
| *H01L 27/12* | (2006.01) |
| *H01L 29/66* | (2006.01) |
| *H01L 29/78* | (2006.01) |
| *H01L 29/786* | (2006.01) |
| *H01L 21/84* | (2006.01) |
| *H01L 21/8238* | (2006.01) |

(52) U.S. Cl.
CPC .... *H01L 29/66477* (2013.01); *H01L 29/66772* (2013.01); *H01L 29/7848* (2013.01); *H01L 21/823807* (2013.01); *H01L 27/1203* (2013.01); *H01L 21/823814* (2013.01); *H01L 29/78618* (2013.01); *H01L 21/84* (2013.01); *H01L 29/66628* (2013.01)

USPC .............. 257/351; 257/E29.255; 257/347

(58) Field of Classification Search
USPC ........... 257/351, 347, 377; 438/163, 149, 154
See application file for complete search history.

(56) References Cited

U.S. PATENT DOCUMENTS

| | | | |
|---|---|---|---|
| 7,202,123 | B1 | 4/2007 | Pan |
| 7,442,601 | B2 | 10/2008 | Pei et al. |
| 7,652,332 | B2 | 1/2010 | Cartier et al. |
| 8,304,301 | B2 | 11/2012 | Cheng et al. |

(Continued)

OTHER PUBLICATIONS

Kah-Wee Ang et al, "Enhanced Strain Effects in 25-nm Gate-Length Thin-Body nMOSFETs With Silicon-Carbon Source/Drain and Tensile-Stress Liner," IEEE Electron Device Letters; vol. 28, No. 4, pp. 301-304, Apr. 2007.

(Continued)

*Primary Examiner* — Jarrett Stark
(74) *Attorney, Agent, or Firm* — Cantor Colburn LLP; Vazken Alexanian

(57) ABSTRACT

A method of forming a transistor device includes forming a patterned gate structure over a semiconductor substrate; forming a spacer layer over the semiconductor substrate and patterned gate structure; removing horizontally disposed portions of the spacer layer so as to form a vertical sidewall spacer adjacent the patterned gate structure; and forming a raised source/drain (RSD) structure over the semiconductor substrate and adjacent the vertical sidewall spacer, wherein the RSD structure has a substantially vertical sidewall profile so as to abut the vertical sidewall spacer and produce one of a compressive and a tensile strain on a channel region of the semiconductor substrate below the patterned gate structure.

8 Claims, 5 Drawing Sheets

(56) References Cited

U.S. PATENT DOCUMENTS

| | | |
|---|---|---|
| 2004/0175872 A1 | 9/2004 | Yeo et al. |
| 2005/0051851 A1 | 3/2005 | Chen et al. |
| 2005/0093075 A1 | 5/2005 | Bentum et al. |
| 2005/0148133 A1 | 7/2005 | Chen et al. |
| 2005/0247983 A1 | 11/2005 | Ting |
| 2006/0057859 A1 | 3/2006 | Chen |
| 2006/0081896 A1 | 4/2006 | Maeda |
| 2006/0258125 A1 | 11/2006 | Langdo et al. |
| 2007/0228482 A1 | 10/2007 | Wei et al. |
| 2008/0020532 A1 | 1/2008 | Monfray et al. |
| 2008/0099846 A1 | 5/2008 | Ohta |
| 2009/0039426 A1 | 2/2009 | Cartier et al. |
| 2009/0108352 A1 | 4/2009 | Majumdar et al. |
| 2009/0108361 A1 | 4/2009 | Wei et al. |
| 2009/0302350 A1 | 12/2009 | Datta et al. |
| 2009/0305471 A1 | 12/2009 | Chang et al. |
| 2009/0311836 A1 | 12/2009 | Cartier et al. |
| 2010/0140707 A1 | 6/2010 | Majumdar et al. |
| 2010/0184265 A1 | 7/2010 | Maitra et al. |
| 2011/0024840 A1 | 2/2011 | Khater |
| 2011/0037125 A1 | 2/2011 | Cheng et al. |
| 2011/0042744 A1 | 2/2011 | Cheng et al. |
| 2011/0115022 A1 | 5/2011 | Cheng et al. |
| 2011/0175152 A1* | 7/2011 | Booth et al. ............ 257/306 |
| 2011/0227157 A1* | 9/2011 | Yang et al. ............. 257/347 |
| 2011/0227159 A1 | 9/2011 | Chan et al. |
| 2011/0233688 A1* | 9/2011 | Ren et al. ............... 257/408 |
| 2011/0272762 A1 | 11/2011 | Booth, Jr. et al. |
| 2011/0309446 A1 | 12/2011 | Doris et al. |

OTHER PUBLICATIONS

King-Jien Chui et al., "Strained-SOI n-Channel Transistor With Silicon-Carbon Source/Drain Regions for Carrier Transport Enhancement," IEEE Electron Device Letters; vol. 27, No. 9, pp. 778-780; Sep. 2006.

Rinus Tek Po Lee et al., "Platinum Germanosilicide as Source/Drain Contacts in P-Channel Fin Field-Effect Transistors (FinFETS)," IEEE Transactions on Electron Devices; vol. 56, No. 7, pp. 1458-1465, Jul. 2009.

International Search Report; International Application No. PCT/EP2011/059176; International Filing Date: Jun. 2, 2011; Date of Mailing: Aug. 22, 2011; pp. 1-6.

A. Talbot et al., "Investigation of Facet Formation in RTCVD Si/SiGe Selective Epitaxy," Meeting Abstracts; The Electrochemical Society, Inc.; Abs. 1345, 1 page, 206th Meeting; 2004.

Yee-Chia Yeo, "Enhancing CMOS Transistor Performance Using Lattice-Mismatched Materials in Source/Drain Regions," Institute of Physics Publishing-Semiconductor Science and Technology; vol. 22, No. 1; pp. S177-S182; 2007.

D. Zhang et al., "Embedded SiGe S/D PMOS on Thin Body SOI Substrate with Drive Current Enhancement," Symposium on VLSI Technology Digest of Technical Papers; 1 page; 2005.

International Search Report—Written Opinion; International Application No. PCT/EP2011/059176; International Filing Date: Jun. 2, 2011; Date of Mailing: Aug. 22, 2011; pp. 1-10.

\* cited by examiner

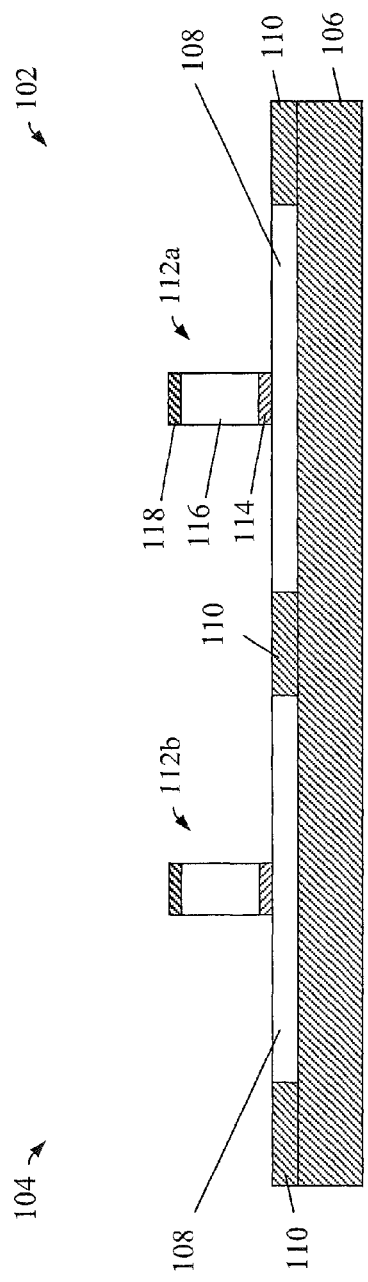
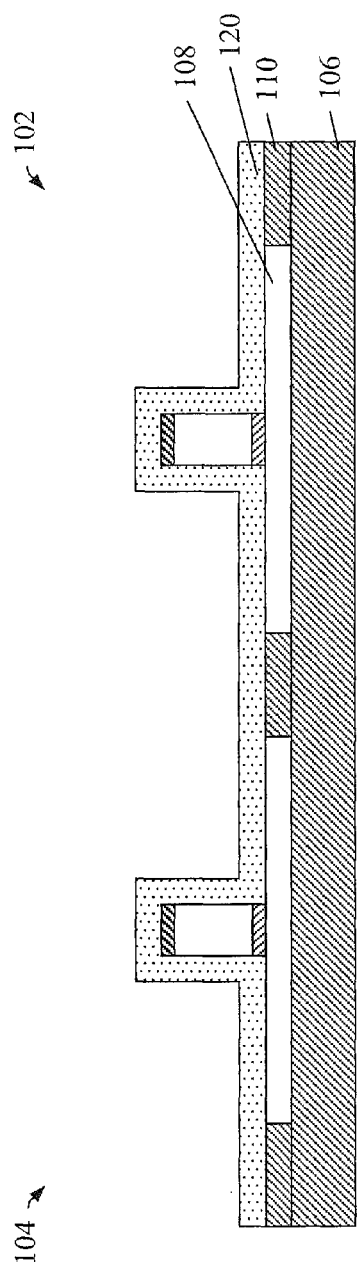
Figure 1(a)
Figure 1(b)

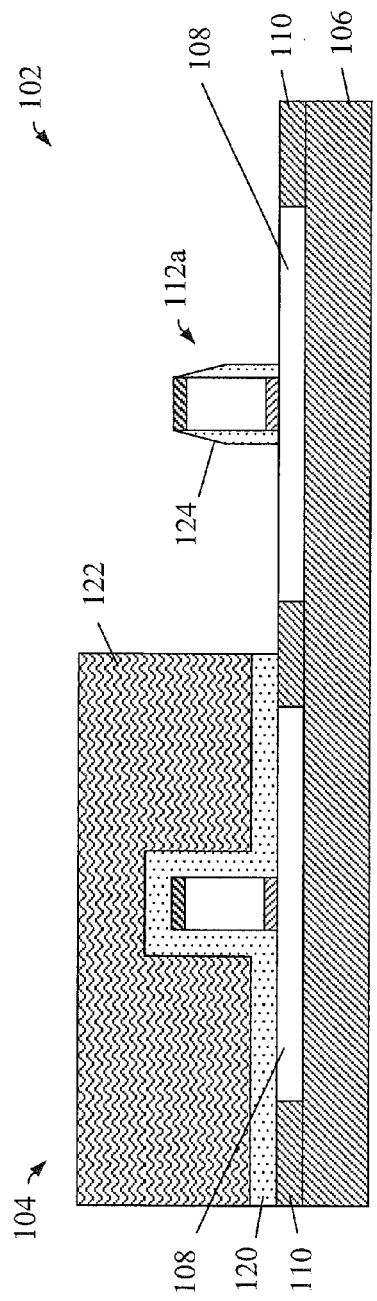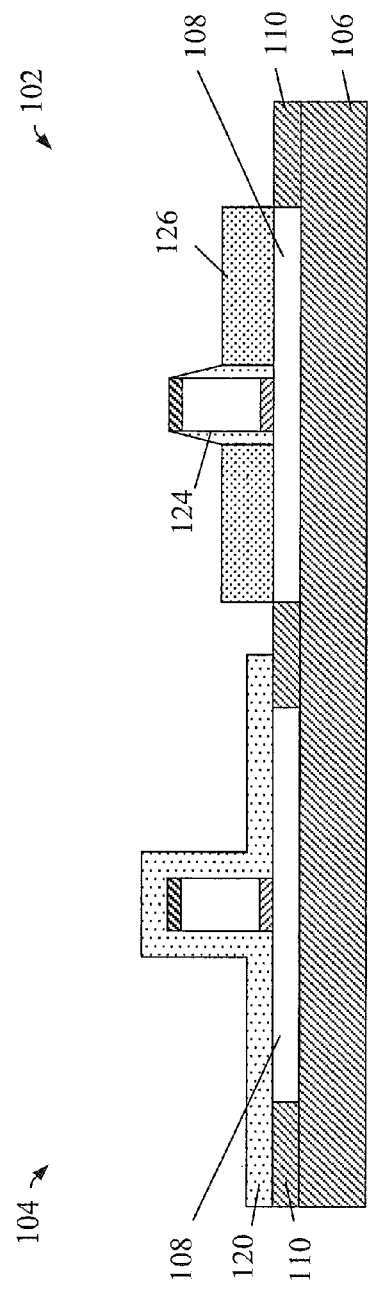
Figure 1(c)
Figure 1(d)

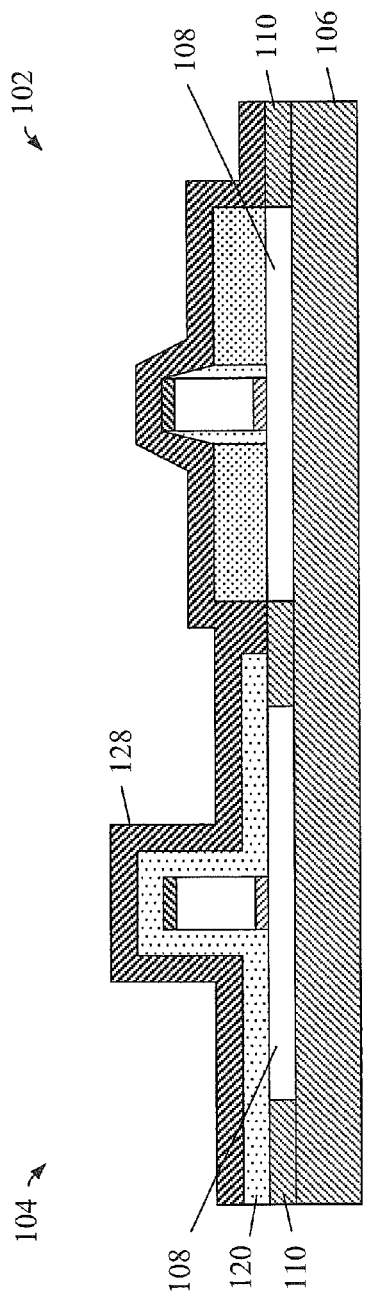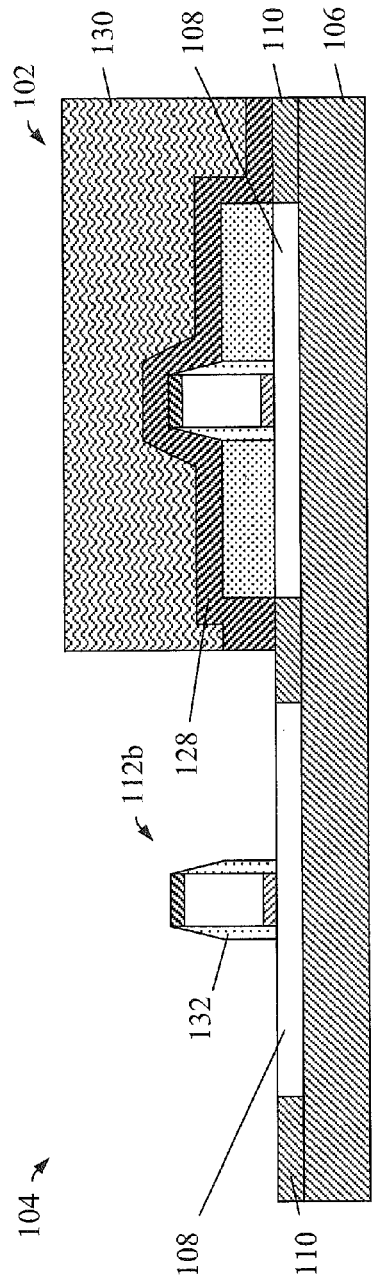

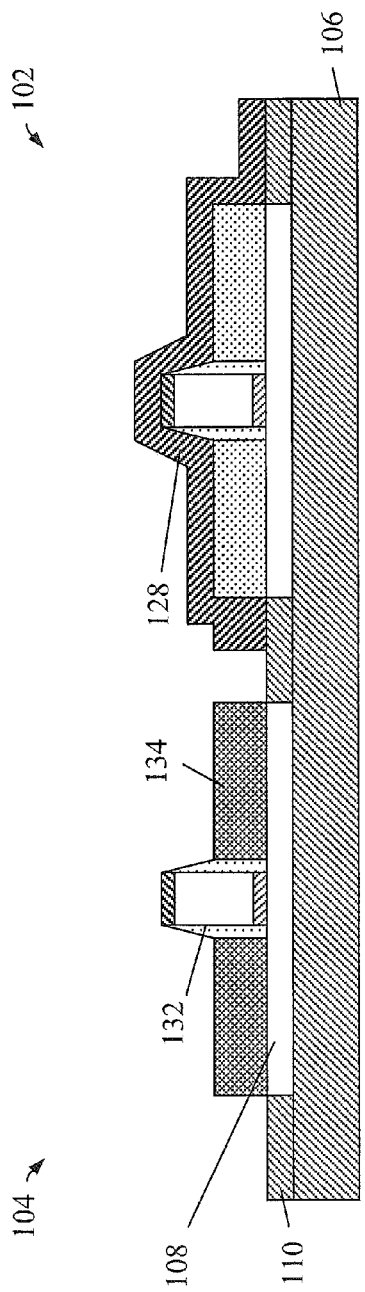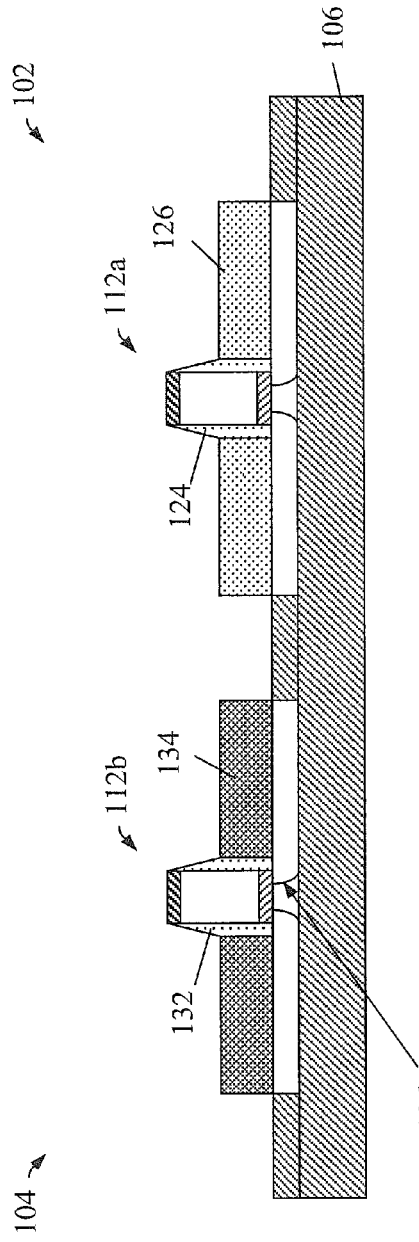
Figure 1(g)
Figure 1(h)

STRAINED THIN BODY CMOS DEVICE HAVING VERTICALLY RAISED SOURCE/DRAIN STRESSORS WITH SINGLE SPACER

CROSS-REFERENCE TO RELATED APPLICATION

This application is a divisional of U.S. patent application Ser. No. 12/816,399, filed Jun. 16, 2010, now U.S. Pat. No. 8,546,228, the disclosure of which is incorporated by reference herein in its entirety.

BACKGROUND

The present invention relates generally to semiconductor device manufacturing and, more particularly, to a strained, thin body transistor device having vertically raised source/drain stressors with a single spacer.

Semiconductor-on-insulator (SOI) devices, such as silicon-on-insulator devices, offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of latchup, which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

The gain of a MOS transistor, usually defined by the transconductance ($g_m$), is proportional to the mobility ($\mu$) of the majority carrier in the transistor channel. The current carrying capability, and hence the performance of an MOS transistor is proportional to the mobility of the majority carrier in the channel. The mobility of holes, which are the majority carriers in a P-channel field effect (PFET) transistor, and the mobility of electrons, which are the majority carriers in an N-channel field effect (NFET) transistor, may be enhanced by applying an appropriate stress to the channel. Existing stress engineering methods greatly enhance circuit performance by increasing device drive current without increasing device size and device capacitance. For example, a tensile stress liner applied to an NFET transistor induces a longitudinal stress in the channel and enhances the electron mobility, while a compressive stress liner applied to a PFET transistor induces a compressive stress in the channel and enhances the hole mobility.

There are several process integration methods for the creation of dual stress films. The underlying theme is the blanket deposition of a first stress layer type, followed by lithography to mask and protect this first stress layer type, an etch to remove the first stress layer type where it is not desired, and then deposition of the second stress layer type. The resulting enhanced carrier mobility, in turn, leads to higher drive currents and therefore higher circuit level performance.

Ultrathin body silicon MOSFETs, such as ETSOI (extremely thin SOI) or FinFETs, are considered viable options for CMOS scaling for the 22 nanometer (nm) node and beyond. However, a thin-body SOI transistor such an ETSOI transistor needs epitaxially grown, raised source/drain regions to achieve a sufficiently low transistor series resistance. Moreover, due to the extreme thinness of the ETSOI layer (e.g., on the order of about 6 nm), embedded source/drain stressors are not a viable means of inducing channel stress, as the trenches used to form embedded stressors are conventionally about 60-80 nm deep into the SOI layer. Consequently, it is a significant challenge to incorporate conventional stress layer techniques into such ultrathin film devices.

SUMMARY

In an exemplary embodiment, a method of forming a transistor device includes forming a patterned gate structure over a semiconductor substrate; forming a spacer layer over the semiconductor substrate and patterned gate structure; removing horizontally disposed portions of the spacer layer so as to form a vertical sidewall spacer adjacent the patterned gate structure; and forming a raised source/drain (RSD) structure over the semiconductor substrate and adjacent the vertical sidewall spacer, wherein the RSD structure has a substantially vertical sidewall profile so as to abut the vertical sidewall spacer and produce one of a compressive and a tensile strain on a channel region of the semiconductor substrate below the patterned gate structure.

In another embodiment, a method of forming a complementary metal oxide semiconductor (CMOS) device includes forming a first patterned gate structure over a semiconductor substrate corresponding to a first polarity type transistor region, and forming a second patterned gate structure over the semiconductor substrate corresponding to a second polarity type transistor region; forming a spacer layer over the semiconductor substrate and the first and patterned gate structures; removing horizontally disposed portions of the spacer layer in the first polarity type transistor region so as to form a vertical sidewall spacer adjacent the first patterned gate structure; forming a first type raised source/drain (RSD) structure over the semiconductor substrate and adjacent the vertical sidewall spacer of the first patterned gate structure, wherein the first type RSD structure has a substantially vertical sidewall profile so as to abut the vertical sidewall spacer of the first patterned gate structure and produce one of a compressive and a tensile strain on a channel region of the semiconductor substrate below the first patterned gate structure; forming a protective hardmask over first and second polarity type transistor regions; removing the protective hardmask and horizontally disposed portions of the spacer layer in the second polarity type transistor region so as to form a vertical sidewall spacer adjacent the second patterned gate structure; forming a second type raised source/drain (RSD) structure over the semiconductor substrate and adjacent the vertical sidewall spacer of the second patterned gate structure, wherein the second type RSD structure has a substantially vertical sidewall profile so as to abut the vertical sidewall spacer of the second patterned gate structure and produce the other of a compressive and a tensile strain on a channel region of the semiconductor substrate below the second patterned gate structure; and removing the protective hardmask in the first polarity type transistor region.

In another embodiment, a transistor device includes a patterned gate structure formed over a semiconductor substrate; a vertical sidewall spacer formed adjacent the patterned gate structure; and a raised source/drain (RSD) structure formed over the semiconductor substrate and adjacent the vertical sidewall spacer, wherein the RSD structure has a substantially vertical sidewall profile so as to abut the vertical sidewall spacer and produce one of a compressive and a tensile strain on a channel region of the semiconductor substrate below the patterned gate structure.

In still another embodiment, a complementary metal oxide semiconductor (CMOS) device includes a first patterned gate structure formed over a semiconductor substrate corresponding to a first polarity type transistor region, and a second patterned gate structure formed over the semiconductor substrate corresponding to a second polarity type transistor region; a vertical sidewall spacer formed adjacent the first patterned gate structure; a first type raised source/drain (RSD) structure formed over the semiconductor substrate and adjacent the vertical sidewall spacer of the first patterned gate structure, wherein the first type RSD structure has a substantially vertical sidewall profile so as to abut the vertical sidewall spacer of the first patterned gate structure and produce one of a compressive and a tensile strain on a channel region of the semiconductor substrate below the first patterned gate structure; a vertical sidewall spacer formed adjacent the second patterned gate structure; and a second type raised source/drain (RSD) structure formed over the semiconductor substrate and adjacent the vertical sidewall spacer of the second patterned gate structure, wherein the second type RSD structure has a substantially vertical sidewall profile so as to abut the vertical sidewall spacer of the second patterned gate structure and produce the other of a compressive and a tensile strain on a channel region of the semiconductor substrate below the second patterned gate structure.

BRIEF DESCRIPTION OF THE SEVERAL VIEWS OF THE DRAWINGS

Referring to the exemplary drawings wherein like elements are numbered alike in the several Figures:

FIGS. 1(a) through 1(i) are cross sectional views of an exemplary method of forming complementary ETSOI transistor devices having vertically profiled, raised source/drain stressors with a single spacer, in accordance with an embodiment of the invention.

DETAILED DESCRIPTION

Figure 1I:
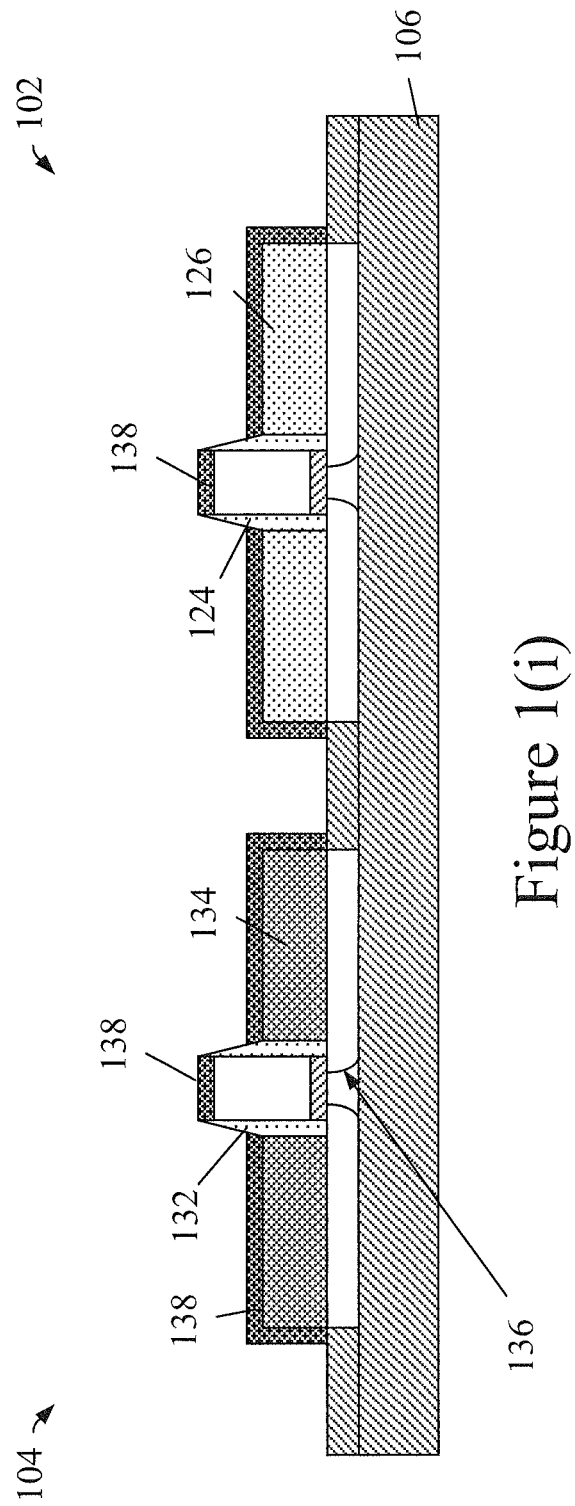

Disclosed herein is a thin body (ETSOI) transistor device having vertically profiled, raised source/drain stressors with a single spacer. Different raised source/drain (RSD) stressors are formed for the NFET and PFET devices so as to provide compressive stress for the channel of the PFET devices and tensile stress for the channel of the NFET devices. In addition, the RSDs of both the NFET and PFET devices are formed so as to abut vertical sidewalls of thin, single gate spacers, which maximize strain transfer to the channel, as well as keeps subsequent silicide contact formation a sufficient distance from the channel. The thin spacer is instrumental in forming MOSFET devices with a tight pitch and enabling reduction in the access resistance.

Referring initially to FIG. 1(a), there is shown a cross sectional view of a CMOS device including a PFET device 102 and an NFET device 104. A buried oxide (BOX) layer 106 (or more generally a buried insulator layer) is formed over a bulk substrate (not shown). In the embodiment depicted, an SOI layer 108 is an ETSOI layer, having an exemplary thickness on the order of about 10 nm or less, such as produced by SOI thinning The PFET device 102 is electrically isolated from the NFET device 104 by insulating regions 110, such as shallow trench isolations (STI) or mesas, for example.

As further illustrated in FIG. 1(a), gate stack structures 112a, 112b, for both the PFET 102 and the NFET 104 are respectively formed, including a gate dielectric layer(s) 114, gate electrode 116, and a protective gate nitride cap 118. The gate stack structures may include any suitable gate dielectric and gate conductor materials known in the art including, for example, high-k/metal gate (HKMG) stack materials. Further, the gate stack materials and/or doping may be the same or may be different for the PFET 102 and the NFET 104, depending on the degree to which individual workfunctions are tailored.

In FIG. 1(b), a spacer layer 120 is formed over both the PFET and NFET devices. The spacer layer 120 is an insulating layer such as, for example, an oxide or a nitride. In the case of a nitride, the spacer layer 120 is formed with a different process with respect to the gate nitride cap 118, so as to result in an etch selectivity therebetween. A photoresist layer 122 is then formed over the devices, and patterned in a manner that exposes the PFET device 102, as shown in FIG. 1(c).

With the hardened resist in place over the NFET device 104, the exposed spacer layer 120 over portions of the PFET device 102 is subjected to a directional etch (e.g., a reactive ion etch (RIE)) that removes horizontally oriented portions of the first spacer layer, thereby forming thin sidewall spacers 124 on the PFET gate stack structure 112a, as further depicted in FIG. 1(c). In FIG. 1(d), the resist over the NFET device 104 is stripped, and PFET raised source/drain structures 126 are epitaxially grown on the ETSOI layer 108. The raised source/drain structures 126 are of a first semiconductor type that will serve to provide a compressive stress on the PFET channel. In an exemplary embodiment, the raised source/drain structures 126 comprise silicon germanium (SiGe).

Because of the small thickness of the ETSOI layer 108, the SiGe formation is also in-situ doped with a suitable p-type dopant material, such as boron (B) for example. In so doing, a conventional dopant ion implant process may be avoided, which may otherwise damage the crystal structure of the ETSOI layer 108 by creating amorphous regions therein and relaxing the strain in the SiGe and Si:C layers. As will also be noted from FIG. 1(d), instead of a faceted or angled RSD sidewall profile, the SiGe RSD structures 126 have sidewalls that vertically abut the thin spacers 124 which, as will be illustrated below, keeps silicide contact formation away from the channel region without the need for forming a second (and consequently thicker) spacer. Moreover, the vertically profiled SiGe RSD structures 126 enhance the compressive stress provided to the channel, in comparison to a faceted profile.

Referring now to FIG. 1(e), a hardmask layer 128 is formed over both the PFET and NFET devices. The hardmask layer 128 may be an oxide layer or a nitride layer, for example. Another photoresist layer 130 is then formed over the resulting structure, and patterned so as to expose the NFET device 104 as shown in FIG. 1(f). Another directional RIE process is then used to remove both the hardmask layer 128 and horizontal portions of the spacer layer 120, thereby forming thin sidewall spacers 132 on the NFET gate stack structure 112b. In FIG. 1(g), the photoresist layer 130 over the PFET device 102 is removed, and NFET raised source/drain structures 134 are epitaxially grown on the ETSOI layer 108. The raised source/drain structures 134 are of a second semiconductor type that will serve to provide a tensile stress on the NFET channel. In an exemplary embodiment, the raised source/drain structures 134 comprise silicon carbon (Si:C).

Similar to the formation of the PFET SiGe RSD structures 126 described above, formation of the NFET RSD structures 134 is also performed by in-situ doping with a suitable n-type dopant material, such as phosphorus (P) for example. As is also the case with the SiGe RSD structures 126, instead of a faceted RSD sidewall profile, the Si:C RSD structures 134 have vertically disposed sidewalls that abut the thin spacers 132, which keeps silicide contact formation away from the channel region without the need for forming a second spacer. Again, the vertically profiled Si:C RSD structures 134 enhance the tensile stress provided to the channel, in comparison to a faceted sidewall profile.

In FIG. 1(h), the device is subject to an anneal that drives in-situ n-type and p-type dopants from the RSD layers into the ETSOI layer, forming the source and drain extension regions 136 below the channel region of the transistors. The remaining hardmask layer over the PFET device 102 is also removed (either before or after the anneal). Finally, as shown in FIG. 1(i), the gate nitride cap is removed, followed by a silicidation process as known in the art to form silicide contacts 138, after which device processing may continue in accordance with existing techniques.

As will thus be appreciated, the present embodiments provide the capability of independently tuning raised source/drain regions in ETSOI substrates to optimize source/drain extension regions and stress conditions for NFET and PFET devices. In contrast to existing techniques, the techniques disclosed herein do not require a second spacer to prevent silicide encroaching into channel, as the vertical RSD sidewall profile keeps the refractory metal a consistent distance away from the channel, roughly corresponding to the height of the RSD structure. It should be appreciated, however, that a second spacer, if so desired, could be formed prior to refractory metal deposition in forming the silicide contacts.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A complementary metal oxide semiconductor (CMOS) device, comprising:
   a first patterned gate structure formed over an extremely thin silicon-on-insulator (ETSOI) semiconductor substrate corresponding to a first polarity type transistor region, and a second patterned gate structure formed over the ETSOI semiconductor substrate corresponding to a second polarity type transistor region, the ETSOI semiconductor substrate having a thickness on the order of about 10 nanometers (nm) or less;
   a first vertical sidewall spacer formed adjacent the first patterned gate structure;
   a first type raised source/drain (RSD) structure formed atop the ETSOI semiconductor substrate and adjacent the first vertical sidewall spacer of the first patterned gate structure, wherein the first type RSD structure has a vertical sidewall profile so as to abut the first vertical sidewall spacer of the first patterned gate structure and produce one of a compressive and a tensile strain on a channel region of the semiconductor substrate below the first patterned gate structure;
   a second vertical sidewall spacer formed adjacent the second patterned gate structure; and
   a second type raised source/drain (RSD) structure formed over the ETSOI semiconductor substrate and adjacent the vertical sidewall spacer of the second patterned gate structure, wherein the second type RSD structure has a vertical sidewall profile so as to abut the second vertical sidewall spacer of the second patterned gate structure and produce the other of a compressive and a tensile strain on a channel region of the semiconductor substrate below the second patterned gate structure.

2. The device of claim 1, wherein the first and second type RSD structures comprise, respectively, epitaxially grown, first and second in-situ doped semiconductor materials.

3. The device of claim 2, wherein the semiconductor material of the first type RSD structure comprises p-type doped silicon germanium (SiGe), and the first type RSD structure produces a compressive stress on the channel region below the first patterned gate structure.

4. The device of claim 3, wherein the p-type material comprises boron (B).

5. The device of claim 3, wherein the semiconductor material of the second RSD structure comprises n-type doped silicon carbon (Si:C), and the second type RSD structure produces a tensile stress on the channel region below the second patterned gate structure.

6. The device of claim 5, wherein the n-type material comprises phosphorous (P).

7. The device of claim 3, further comprising a silicide layer formed over the first and second type RSD structures and the first and second patterned gate structures, with the substantially vertical sidewall profiles of the first and second type RSD structures adjacent the vertical sidewall spacers sufficient to prevent the silicide layer from encroaching into the channel regions.

8. The device of claim 1, wherein the first sidewall spacer abuts a gate dielectric layer of the first patterned gate structure and the second sidewall spacer abuts a gate dielectric layer of the second patterned gate structure.

* * * * *